United States Patent [19]

Lichtensperger

[11] Patent Number: 4,903,167
[45] Date of Patent: Feb. 20, 1990

[54] CASING FOR ACCOMMODATING ELECTRIC AND/OR ELECTRONIC COMPONENTS

[75] Inventor: Ernst Lichtensperger, Eching, Fed. Rep. of Germany

[73] Assignee: Schleicher for Accommodating Electric GmbH & Co. KG, Oberschleissheim, Fed. Rep. of Germany

[21] Appl. No.: 208,576

[22] Filed: Jun. 13, 1988

[30] Foreign Application Priority Data

Jun. 12, 1987 [DE] Fed. Rep. of Germany ... 8708332[U]

[51] Int. Cl.$^4$ .............................................. H05K 1/14
[52] U.S. Cl. .................................. 361/395; 174/50.51; 174/50.54; 174/52.1; 361/399; 361/417; 361/419
[58] Field of Search ................. 174/50.51, 50.54, 52.1; 361/394, 395, 399, 417, 419–420

[56] References Cited

U.S. PATENT DOCUMENTS

| 3,737,729 | 6/1973 | Carney | 361/395 |
| 4,092,698 | 5/1978 | Bretka | 361/346 |
| 4,528,616 | 7/1985 | Koppensteiner | 361/399 |
| 4,672,510 | 6/1987 | Castner | 361/394 |
| 4,713,633 | 12/1987 | Saito et al. | 361/394 |

FOREIGN PATENT DOCUMENTS 2638257 8/1976 Fed. Rep. of Germany ...... 361/399

Primary Examiner—Gregory D. Thompson
Attorney, Agent, or Firm—Arnold S. Weintraub; William D. Blackman

[57] ABSTRACT

In a casing for accommodating electronic components mounted on a printed circuit board, a lower box has a substantially U-shaped cross section, and includes a floor and at least two side walls. Each of the side walls has a horizontal slot proximate an upper edge thereof. At least one of the side walls has a resilient snap nose formed therein which is biased inwardly in the casing. A lid is also provided for closing the lower box, and the lid may have a closing edge thereon formed as a cross-sectionally double obtuse-angled stop tongue. A bead may be provided on a lower portion of the snap nose to orient a pc board in the casing.

6 Claims, 1 Drawing Sheet

CASING FOR ACCOMMODATING ELECTRIC AND/OR ELECTRONIC COMPONENTS

BACKGROUND OF THE INVENTION

1. Field of the Invention

The present invention relates to a casing for accommodating electric and/or electronic components of all types which are disposed upon a printed circuit board (pc board), consisting of a lower box with U-shaped cross section, and a lid having a plane surface and closing said lower box.

2. Prior Art

With casings of a type here referred to as used in particular for modular construction units to be either introduced into associated switch boxes or to be inserted into associated casing frames, frequently the disadvantage is felt that supplementary means such as bolts or special locking devices are required for closing them, which means an additional consumption of time during assembly. Other casings are known in which the lid may be force-lockingly or form-lockingly snapped on, however, as a rule, there is no possibility of opening said lid without destroying it.

This is the point where the here described innovation commences, the object of which is to improve a casing of the aforementioned type so that both the closing and the opening will become possible without any problem and without supplementary closing means, and simultaneously the insert—in the casing under consideration a printed circuit board—to be accommodated within said casing is to be fixed without taking recourse to bolts, rivets or other locking means which are extraneous to said casing.

SUMMARY OF THE INVENTION

The solution of this problem, according to the present invention, is solved by the characteristics as stated in the characterizing clause of claim 1. Advantageous embodiments of said solution of the problem and further developments result from the above subclaims.

The fact that both the printed circuit board to be inserted into said casing and the lid closing said casing are locked at and in same and are held force-lockingly and form-lockingly on the provided location solely due to a special shape of the casing itself, facilities considerably both assembly and disassembly, at the same time simplifying the build-up of the casing and minimizing the required quantity of piece parts.

Further advantages and particulars of the present invention will be explained in more detail taking recourse to the attached drawings, which illustrate:

DETAILED DESCRIPTION OF THE PREFERRED EMBODIMENT

Figure 1:
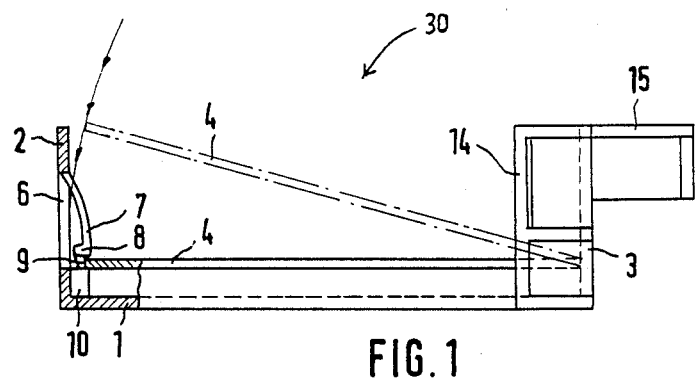
FIGS. 1 and 2: cross section of a first and second embodiment the casing, respectively, demonstrating the insertion of a printed circuit board.

As will be seen from FIG. 1 of the drawing, the lower box 30, which has a U-shaped cross section, includes three casing walls 1, 2, 3, the numeral 1 designating the bottom of said casing from , which the side walls marked with the reference numerals 2 and 3 are perpendicularly directed upward. The casing parts 14 and 15 in the area of the casing wall 3 serve other purposes which do not develop the here presented innovation further so that we need not go more into such details.

It is essential that one or more recesses 6 are cut out of one of said side walls 2 so that the wall material defining said recess or recesses 6 is bent as an integral part of said casing wall 2 toward the interior of said casing in the shape of lugs, latches or tongues, in order to form there one or more snap noses 7. The snap noses 7 are for locking a printed circuit board 4 in place as seen in FIG. 1. For that purpose, a U-shaped slot is provided around three sides of each snap nose 7 at the respective locations in the casing wall 2. The snap nose 7 is bent inwardly from the plane of the casing wall 2 as will be seen from FIG. 1, being furthermore shaped so as to make the bracket-shaped snap nose of FIG. 1 with an essentially rectangular protrusion 8 at the free end of said snap nose. This causes every snap nose 7 in accordance with the embodiment of FIG. 1 to have a flat back for inserting said printed circuit board 4 against the bias of the snap nose 7, the left edge of said printed circuit board as seen in FIG. 1 being able to glide with low friction over said flat back due to the selected curvature, thus pushing back said snap nose into said recess 6 prestressed in the direction of the interior of said casing, until the printed circuit board 5 has reached its installation position on a rest 10, whereupon the snap nose 7 springs back into its former position as shown in FIG. 1.

Figure 2:
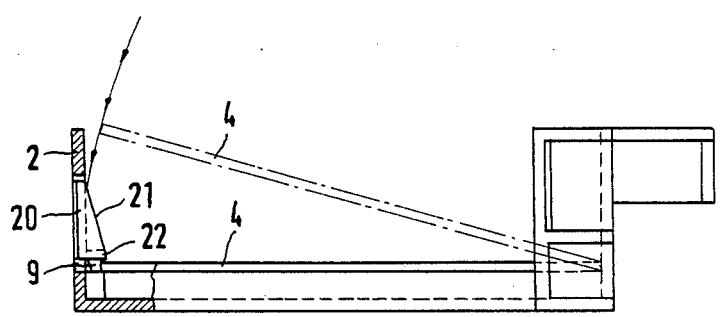

A second embodiment of a snap nose 20 is represented in FIG. 2 being likewise an integral part of the casing wall 2 and having a U-shaped cut-out therearound, the free end of said snap nose being situated in front and the end connected with the casing being in the rear, seen in the direction of view upon the drawing plane. A slope 21 is tip-stretched at the free end, which extends over only a part of the length of the snap nose 20 within the U-shaped cut-out. Also the snap nose 20 is provided with a protrusion 22 analogous to the protrusion 8 in FIG. 1, which extends rectangularly from the part of the snap nose situated within the casing wall, and is located beside the slope 21 at the largest width of same.

The printed circuit board 4 is inserted by first introducing it in slanting position from left toward right into said casing as indicated by the dot-dash line of FIG. 2, until its edge engages into a groove or stop made in the casing wall 3 and not represented in the drawing, whereupon it is then pressed downward along the arrow curve sliding along the inner curved back of the snap nose 7 or the slope 21 of the snap nose 20 which is pressed outwardly with respect to the casing, until the circuit board 4 reaches the rest position represented in FIGS. 1 and 2 by solid lines.

On the flat of the protrusion 8 or 22 adjacent to the printed circuit board 4, a bead 9 is provided which engages form-lockingly into an associated hole or recess within the associated surface of the printed circuit board 4 thereby also form-lockingly defining the angular position of the snap nose 7, 20. It is possible to provide a plurality of such snap noses 7, 20 along the casing wall 2, however, frequently a single snap nose within the casing is sufficient for safely locking the printed circuit board 4 into position.

After inserting the printed circuit board 4 into the lower box 30 which is safely held there, now a lid 5 may be put thereon in order to close same as desired. For this purpose, slots 16 and 19 are provided immediately adjacent to the two upper edges 17 and 18 of the casing walls 2 and 3. The affected edge areas of the lid 5 to be inserted there form stop tongues 12 which are defined as double, obtuse-angle displacements of the edge areas as will be seen from FIG. 3. Preferably a plurality of slots 16, 19 and associated stop tongues 12 are provided on the edge areas of the lid in order to permit the alignment of the lid surface with the upper edges 18 and 17. The lid 5 is preferably inserted at first into the slots 16 along the side wall 3 and then snapped into the slots 19 within the side wall 2, but also the reverse action, i.e., to insert it at first into the slots 19 and then to snap it into the slots 16, is possible.

Figure 3:
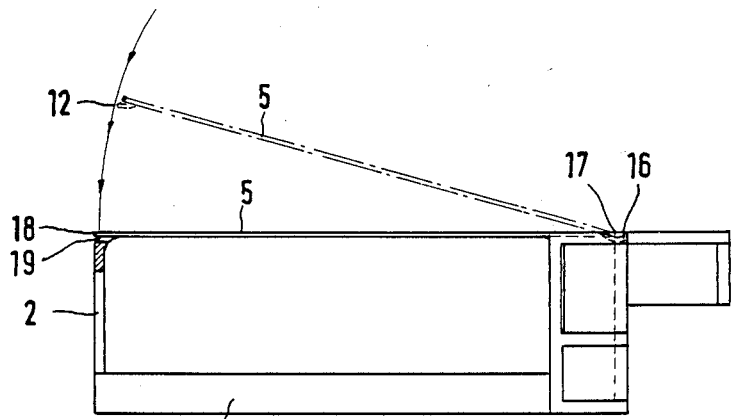
FIG. 3: a part-sectioned drawing of a front view of the casing, representing the insertion and locking of the lid.

A lateral part 13 closes the front side of the lower box 30 only partly across the area of the printed circuit board 4 as seen in FIG. 3.

At least one accommodation device for an electric connection element may be provided in the casing wall 2 or 3. Said electric connection element will have thereby the form of a chassis clamp and is provided with elastic arms which extend diagonally upward or downward respectively from a back part. The casing wall is provided with guides, e.g., dovetail guides, into which the back part of said chassis clamp is inserted. An embossment directed toward the casing wall is formed in said back part, which engages into a recess provided in the casing wall 2, 3, causing thus a prestress upon said elastic arms which press upon said printed circuit board in its inserted position establishing thus an electric connection with a conductor path on the printed circuit. When the lid 5 is set into place, the upper arms of said chassis clamp press against the lid which consists of metal establishing thus an electric connection also there.

The lid being of metal has at the same time the function of a shielding protecting the components on the printed circuit board against any disturbing radiation.

Having, thus, described the invention, what is claimed is:

1. A casing for accommodating a printed circuit board (pc board), comprising:
    a lower box having a substantially U-shaped cross section, comprising a floor and at least two upstanding side walls, each side wall having a horizontal slot formed proximate an upper edge thereof, at least one of the side walls having a resilient snap nose formed therein which is normally biased inwardly in the casing, and
    a lid for closing said lower box; characterized in that the snap nose has a bead attached thereto which is engagable with a recess in a pc board to orient and lock said pc board within said casing, and that said lid has a closing edge on one side thereof which fits into at least one of the horizontal slots of said casing.
2. The casing of claim 1, characterized in that said closing edge of the lid is formed as at least one double obtuse-angled stop tongue.
3. The casing of claim 1, characterized in that said snap nose is formed with a projection with a free end which points toward the side wall to which the snap nose is attached.
4. The casing of claim 1, characterized in that said snap nose is provided with a slope.
5. The casing of claim 4, characterized in that a projecting directed inwardly is provided in the vicinity of the largest width of said slope.
6. The casing of claim 1 characterized in that said lid consists at least partly of metal.

* * * * *